United States Patent [19]
Saliba

[11] Patent Number: 5,894,425
[45] Date of Patent: Apr. 13, 1999

[54] WIRELESS SECONDARY INTERFACE FOR DATA STORAGE DEVICE

[75] Inventor: George A. Saliba, Northboro, Mass.

[73] Assignee: Quantum Corporation

[21] Appl. No.: 08/807,925

[22] Filed: Feb. 28, 1997

[51] Int. Cl.[6] .................................................. G06F 1/00
[52] U.S. Cl. ................ 364/708.1; 345/169; 711/154; 711/156
[58] Field of Search .......................... 364/708.1; 178/18; 340/825.52; 395/152; 359/113, 142; 345/329, 169

[56] References Cited

U.S. PATENT DOCUMENTS

| | | | |
|---|---|---|---|
| 4,628,541 | 12/1986 | Beavers | 455/603 |
| 4,979,055 | 12/1990 | Squires et al. | 360/69 |
| 5,307,297 | 4/1994 | Iguchi et al. | 364/708.1 |
| 5,402,518 | 3/1995 | Lowery | 395/2.1 |
| 5,444,192 | 8/1995 | Shetye et al. | 178/18 |
| 5,459,458 | 10/1995 | Richardson et al. | 340/825.52 |
| 5,539,658 | 7/1996 | McCullough | 364/514 A |
| 5,600,471 | 2/1997 | Hirohashi et al. | 395/152 |
| 5,627,349 | 5/1997 | Shetye et al. | 178/18 |
| 5,636,264 | 6/1997 | Sulavuori et al. | 359/113 |

*Primary Examiner*—John W. Cabeca
*Assistant Examiner*—Fred F. Tzeng
*Attorney, Agent, or Firm*—David B. Harrison; Debra A. Chun

[57] ABSTRACT

A mass storage device includes a secondary bidirectional interface digital port connected to an embedded microcontroller, and a wireless communications path, such as an optical infra-red (IR) path, connected to the secondary bidirectional interface port for providing a wireless bidirectional secondary communications path between the embedded microcontroller and an external service unit which is not directly connected to the digital computer via a primary electrical bus structure.

11 Claims, 3 Drawing Sheets

WIRELESS SECONDARY INTERFACE FOR DATA STORAGE DEVICE

FIELD OF THE INVENTION

The present invention relates to a secondary data exchange interface for accessing a digital mass storage device such as a tape drive, or a disk drive. More particularly, the present invention provides a wireless secondary communications interface between a control data/acquisition unit and a mass storage device.

BACKGROUND OF THE INVENTION

Advances in embedded controller technology have enabled computer mass storage devices having embedded controllers to include self-contained test, adaptation, upgrade and diagnostics capabilities. For example, modem streaming linear tape drives, such as the present assignee's DLTT™ tape drive products are equipped to perform very comprehensive tests, and these drives store a large amount of information about failure modes and applicable commands, and maintain this information even during a power failure. These drives also have an important capability allowing updating of drive control software any time an upgrade is required or desired.

Diagnostic routines have been carried out via communications over the main bus structure interconnecting the storage device with a host computer, such as a Small Computer System Interface (SCSI) bus. While testing over the primary bus is practical so long as the interface remains functional, the primary bus interface structure remains the only direct access to the embedded controller. Some error or diagnostic conditions make use of the primary bus structure impractical. Also, after the drive has been installed in the computer, diagnosis of fault conditions possibly involving the drive has typically required entry into the computer housing, and frequently the removal of the drive for separate testing and handling. As disk drives are being made to store ever-increasing amounts of user data, the drives have become more sensitive to handling during installation and removal. Thus, minimizing handling of hard disk drives after installation into a computer would be very desirable in order to minimize damage.

Present state-of-the-art tape drives and other mass storage devices frequently make use of a variety of port expanders, serial ports and special command sets over the SCSI bus primary interface in order to provide input and output for testing and problem diagnosis during the design, validation and manufacturing processes.

One example of a secondary port useful for data exchange within the design, validation and manufacturing processes is described in U.S. Pat. No. 4,979,055 to Squires et al., entitled: "Disk Drive System Controller Architecture Utilizing Embedded Real-Time Diagnostic Monitor". The Squires et al. patent describes a micro-controller based hard disk drive. A secondary serial port and communications path was provided from the micro-controller to a "dumb" terminal. Results of a diagnostic monitor routine executed by the micro-controller were communicated via the serial port to the dumb terminal and displayed thereon for later analysis and/or corrective action by the design/manufacturing team. In addition, the secondary serial port enabled diagnostic routines to be downloaded from an external computer to the disk drive, stored in a random access memory chip on board the drive and later executed by the drive's embedded micro-controller. The serial port was typically accessed by a secondary jack or edge connector formed on a printed circuit board carrying the drive circuitry, but not conveniently available once the drive was installed within a computer cabinet or housing.

While the additional port capability is useful within the drive design, checkout and manufacturing operations, this capability is not generally available at the user/customer site. For example, the secondary connector was generally inaccessible after the drive was installed into a computer cabinet, such as a personal computer, and was accessible only after first removing the drive from the computer housing or by disturbing the computer's wiring.

Most mass storage devices present a front panel appearance within the computer housing. This is particularly true of digital tape drives, and disk drives servicing removable media. Hard disk drives are also frequently provided with a panel bezel which is presented as part of the front panel of the computer. A hard disk drive activity light-emitting diode (LED) is most frequently included in the front panel bezel, in order to provide a visual indication of hard disk drive activity during computer operations.

It is known to connect certain peripheral devices to a computer via a wireless connection. For near range connections, infra-red light transmission and reception is an available choice. One example of a battery powered computer keyboard employing one-way wireless signaling to a personal computer is described in U.S. Pat. No. 4,628,541 to Beavers, entitled: "Infra-Red Data Communications System for Coupling a Battery Powered Data Entry Device to a Microcomputer". Other examples of near range wireless paths are known. U.S. Pat. No. 5,539,658 to McCullough, entitled: "Electronic Presentation System Using Portable Storage Media" describes a wireless communications path from a laptop computer to an electronic display device, enabling remote selection of images from an image database previously copied to the display device. U.S. Pat. No. 5,402,518 to Lowery, entitled: "Sound Storage and Sound Retrieval System Having Peripheral with Hand Operable Switches", describes a wireless hand held voice recording and playback peripheral device which works in conjunction with a programmed personal computer to record and play back sound files.

A hitherto unsolved need has remained for an effective way of accessing a mass storage device via a wireless bidirectional secondary data path accessible via a front panel of the device and/or after the device has been installed in a computer without disturbing the computer cabling.

SUMMARY OF THE INVENTION

A general object of the present invention is to provide a wireless secondary bidirectional data path to an embedded controller of a mass storage device in a manner overcoming limitations and drawbacks of prior approaches.

Another object of the present invention is to provide a system for wireless data access to a mass storage device without using conventional cabling establishing a primary bus connection of the device to a computing system.

In accordance with one aspect of the invention, a computer mass storage device includes an embedded device microcontroller, and a primary user data interface structure for passing digital user data recorded on storage media to a digital computer electrically connected to the computer mass storage device via a primary electrical bus structure. In this aspect of the invention the mass storage device further includes a secondary bidirectional interface digital port connected to the device microcontroller, and a wireless communications path connected to the secondary bidirectional interface port for providing a wireless secondary communications path between the device microcontroller and an external digital unit not directly connected to the digital computer via the primary electrical bus structure.

As another aspect of the present invention, a computer mass storage device includes an embedded device microcontroller, and a primary user data interface structure for passing digital user data recorded on storage media to a digital computer electrically connected to the computer mass storage device via a primary electrical bus structure. In this aspect of the invention the mass storage device is included in a housing which also includes the digital computer. The mass storage device, such as a digital streaming tape drive, digital optical disk drive, or digital hard disk drive, includes a front panel accessible to the user externally of the housing, a bidirectional optical path extending through the front panel, a bidirectional optical light emission/detection unit, such as an infra-red (IR) transmission/reception unit, in the optical path, an optical path emission/detection support circuit connected to the emission/detection unit and a secondary bidirectional interface digital port which interconnects the device microcontroller and the optical path emission/detection support circuit. This arrangement enables and facilitates a secondary bidirectional interface port between the device and a compatible external digital unit also equipped with a complementary optical light emission/detection unit.

One more aspect of the present invention is a service unit for accessing a computer mass storage device. The service unit itself may be a general purpose, battery powered, programmed personal digital assistant (PDA); or, it may be a general purpose, battery powered, programmed laptop computer. The mass storage device includes an embedded device microcontroller, a primary user data interface structure for passing digital user data recorded on storage media to a digital computer electrically connected to the computer mass storage device via a primary electrical bus structure, and a wireless secondary bidirectional interface connected to the device microcontroller. In accordance with the present invention the service unit includes a wireless communications unit for providing bidirectional digital communications with the device microcontroller via the wireless secondary bidirectional interface. Preferably, the wireless secondary bidirectional interface comprises infra-red transmission and reception units at the mass storage device and at the service unit. Also, the wireless communications unit may be formed on a PC card installed within a PC card slot of the service unit. In this aspect the PC card may further comprise firmware for controlling access to the computer mass storage device via the service unit.

As one more aspect of the present invention a secondary data communications system is provided for a computing system including a computer mass storage device having an embedded device microcontroller and a primary user data interface structure for passing digital user data recorded on storage media to a user digital computer electrically connected to the computer mass storage device via a primary electrical bus structure. In this aspect of the invention the mass storage device further comprises a secondary bidirectional interface digital port connected to the device microcontroller, and a first wireless communications unit connected to the secondary bidirectional interface port for providing a wireless secondary communications path the device microcontroller. The secondary data communications system further includes a mobile digital communications device including a second wireless communications unit for communicating with the first wireless communications unit thereby to exchange data between the mobile communications device and the computer mass storage device without using the primary electrical bus structure.

As a related aspect, the secondary data communications system further may include a remote host computer linked to the mobile digital communications device by a radio frequency link, such as an analog or digital cellular radio link.

These and other objects, advantages, aspects and features of the present invention will be more fully understood and appreciated by those skilled in the art upon consideration of the following detailed description of a preferred embodiment, presented in conjunction with the accompanying drawings.

BRIEF DESCRIPTION OF THE DRAWINGS
In the Drawings.

DETAILED DESCRIPTION OF PREFERRED EMBODIMENTS

Figure 1:
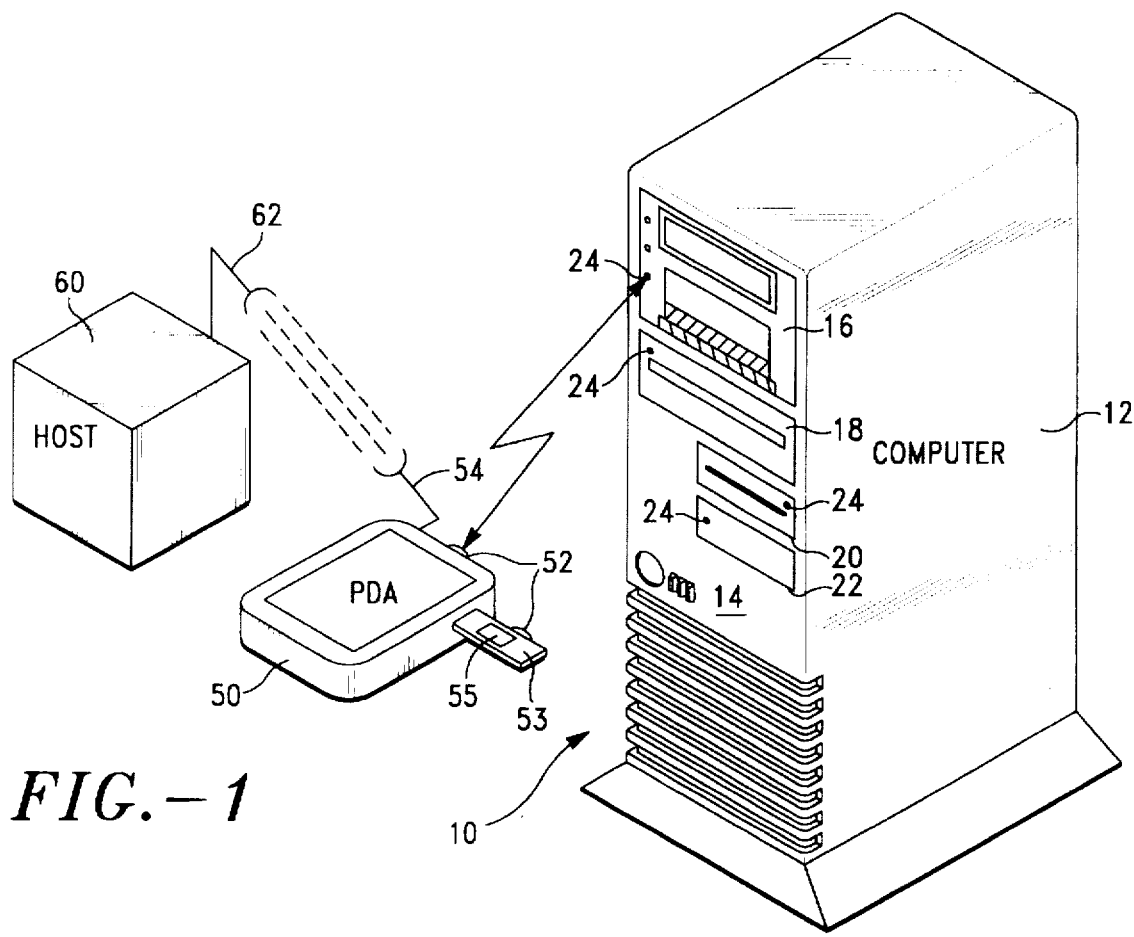
FIG. 1 is an isometric view of a computer including mass storage peripherals supporting wireless secondary data paths at a front panel of the computer in accordance with principles of the present invention.

FIG. 1 provides a first preferred example of principles of the present invention. A computer 10 includes a housing 12 having a front panel 14. The front panel 14 provides openings for access to a number of drive bays or wells within the housing 12. In the FIG. 1 example a streaming tape drive 16, an optical compact disk drive 18, a floppy disk 20 and a hard disk 22 are shown installed in the bays and are connected to a motherboard within the housing 12 by conventional cabling providing bus connections. In the present example each mass storage device 16, 18, 20 and 22 has at least one bidirectional IR unit 24 extending through a front bezel and having at least a lens visible to an operator facing the front panel 14. In accordance with principles of the present invention the IR unit 24 provides a secondary wireless IR bidirectional data port optically accessible via the front panel 14.

Figure 2:
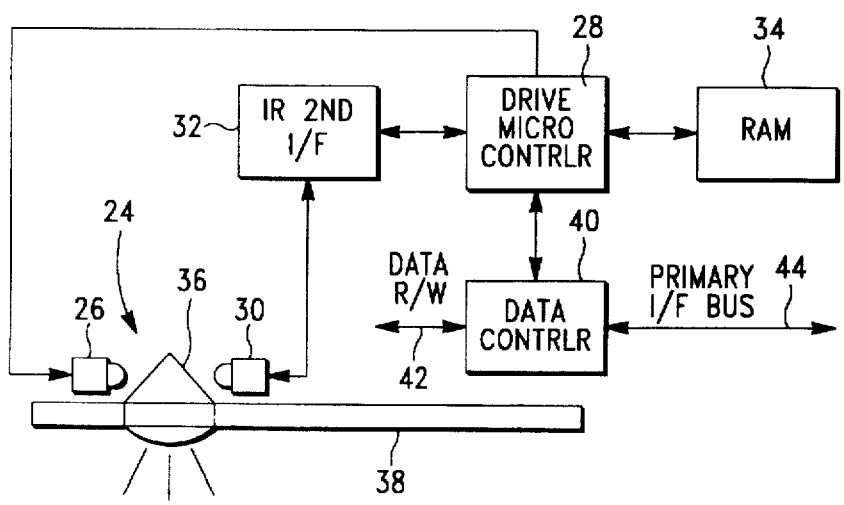
FIG. 2 is an enlarged diagrammatic plan view of a front panel bezel showing a dual-purpose light emitting diode structure and an electrical block diagram of related circuitry in accordance with principles of the present invention.

In the FIG. 2 example, the IR unit 24 includes an infra-red send/receive LED assembly 30 connected to a secondary interface circuit 32. The secondary interface circuit 32 communicates directly with a microprocessor 28 embedded within the drive. The microprocessor 28 is connected to an internal random access memory 34 which stores control firmware executed by the microprocessor 28, including diagnostic routines and test results. The drive microprocessor 28 is also connected to a data controller block 40 which supervises passage of data blocks between a data read/write path 42 and a drive primary interface bus 44, such as a SCSI bus. With this arrangement, and with suitable programming of the microprocessor 28, data may be sent to and received from an external IR unit by the drive microprocessor 28.

Generally, the IR assembly 30 may have optical paths extending directly through a front panel 38 of the drive. In some circumstances justifying additional complexity, it may be useful to share a single light path with a visible LED, such as LED 26 which emits visible light waves. In this special circumstance the at least one IR unit 24 is a dual purpose device, such as shown in FIG. 2. A purpose in addition to providing a secondary port is to provide a visible activity or status indication by emission of visible light waves to an operator facing the front panel 14. Accordingly, the visible light LED 26 is driven by a binary output port pin of the embedded drive microcontroller 28. A prism structure 36 splits an incoming/outgoing optical path extending through the front panel 38 into two light components: one for the visible LED 26 and one for the IR assembly 30. By providing a dual purpose LED 24, a computer user need not be made aware of the availability of the secondary port at the front panel. Light emissions from the visible LED 26 will be understood as conventional drive status indications. This visual activity will, in some operating instances, allay lay user concern about an LED which otherwise is not seen to operate. Also, this approach enables the optical IR assembly 30 to be disguised and hidden from general view.

Returning to FIG. 1, a field unit 50 such as a battery powered laptop computer or a so-called "personal digital assistant" or "PDA", includes an IR send/receive unit 52. Most preferably, although not necessarily, the IR unit 52 is a portion of a PCMCIA card or "PC card" 53 which additionally includes IR unit support circuitry as well as e.g. a memory chip 55 holding unique firmware for adapting the device 50 to the special purpose of communications with the drive via the IR secondary port. Ideally, the PC card 53 includes certain firmware safeguards in local memory 55 which restrict access to the secondary port to authorized users. Software data encryption keys and tokens may also be included in the firmware resident in the local memory 55 of the PC card 53 in order to provide additional safeguards to limit the level of access and to guard against unauthorized use of, or access to, the secondary port of each compatibly-equipped drive.

Additionally, although not necessarily, the field unit 50 may include a wireless radio send/receive unit 54 enabling e.g. cellular wireless communications with a remotely located host computer 60 also equipped with a compatible cellular wireless communications unit 62. The field unit 50 is particularly well suited for use by authorized field service personnel in providing wireless access to the drives 16, 18, 20 and 22 within computer 12 without having to open up the housing 12 or disturb the internal cabling. The field unit 50 may be used to download diagnostics reports from the drive being interrogated, and to upload firmware upgrades and code fixes to the drive as may be desired.

In a device-quiescent (idle) operating mode the microprocessor 28 of a storage device such as tape drive 16 periodically scans the IR interface 32. If the field unit 50 emits an appropriate IR signal to the LED assembly 24, this condition will be sensed by an IR detector within IR assembly 30 and immediately sent to interface 32. The field unit 50 thus establishes a two-way secondary signaling path with the drive 16 and can obtain status and diagnostics information from the drive 16 or provide test routines or firmware updates to the drive 16, as desired. This information can then be relayed to, and new or further information obtained from, the remote host computer 60 via the cellular path. A separate interface routine may be provided for each type of drive equipped with the secondary interface 24 merely by invoking the appropriate control routine at the field unit 50.

Figure 3:
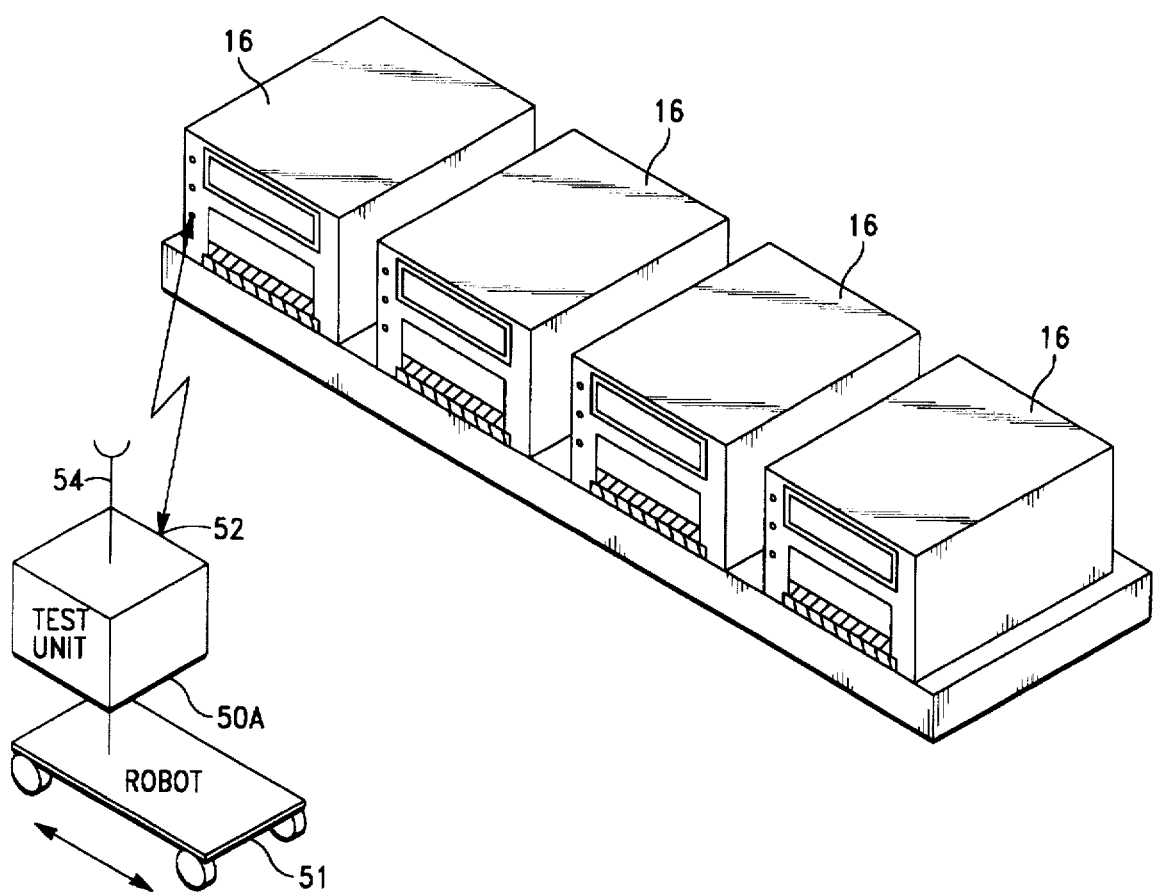
FIG. 3 is an isometric view of an assembly line of tape drives wherein each tape drive provides a secondary wireless data path from a front panel to a sending/receiving device in accordance with principles of the present invention.

FIG. 3 illustrates a modified application of the present invention for use within a tape drive factory. In this environment, a plurality of assembled tape drives 16 (four are shown resting on a rack 70) may be tested by a factory unit 50A which may optionally include a robotic transporter 51 without need for loading tapes into the drives. The factory unit 50A includes an IR front end 52 and may include a wireless link 54 so that a remote host may receive the test data and control the robot 51. Alternatively, the robot 51 may pass the drives 16 in front of a stationary factory unit 50A. During these tests, primary power is applied to the tape drives 16.

Figures 4, 5:
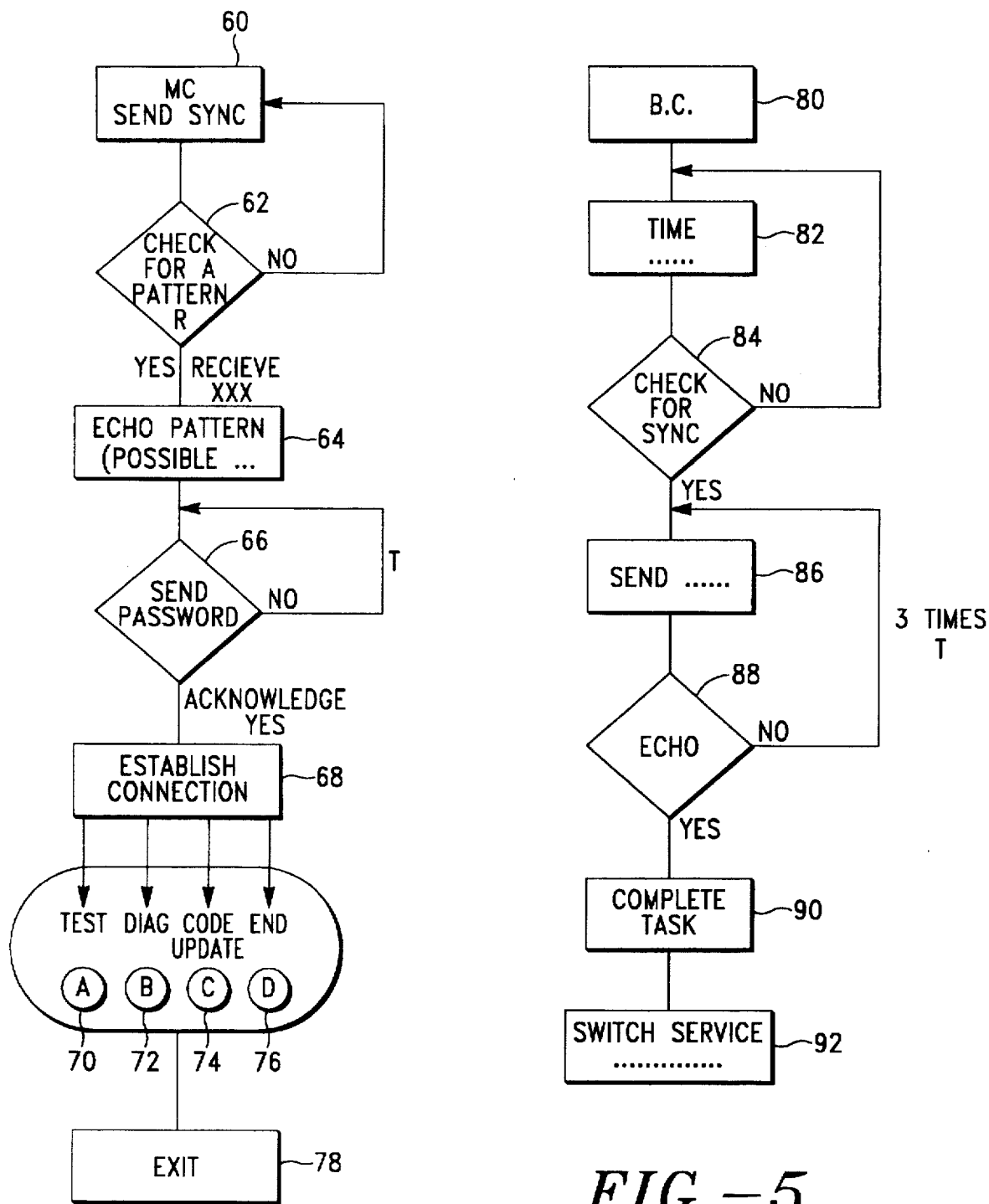
FIG. 4 is a flow diagram of a communication routine executed by a mobile communicator in accordance with principles of the present invention.
FIG. 5 is a flow diagram of a communication routine executed by a base communicator within a mass storage device in accordance with principles of the present invention.

FIGS. 4 and 5 set forth flow charts for the IR send/receive mobile communications unit 52 in the field unit 50 and for the base IR communications unit 30 in a drive 16, respectively. Turning to FIG. 4, the mobile communications unit 52 sends a predetermined sync optical pulse pattern at a step 60. A logical step 62 determines if a return pattern is received. If a return pattern is not detected, the field unit flow process loops back to repeat the step 60. However, if a return pattern is received, a step 64 checks to validate the pattern, in order to remove any extraneous noise or stray IR signals. If the return pattern is valid, an echo pattern is then sent to the drive 16 to request a further pattern, such as a unique password. A logical step 66 is then reached which checks for the password. If the password is not received, another request for the password is sent out, and step 66 is repeated. When the password is received and validated at step 66, an acknowledge signal is sent to the drive 16, and a step 68 is reached which establishes a connection between the field unit 50 and the drive 16.

The field unit 50 then enables its user to request one of a plurality of actions, including by way of example, a drive test routine 70 which typically includes reading an electronically recorded drive serial number, a drive diagnostics data retrieval operation 72, a firmware code update operation 74 and an end of session command 76. When the end of session command 76 is entered, the field unit 50 firmware reaches an exit step 78. The field unit 50 may then be used to transfer information thus collected about drive 16 to the host computer via the second wireless link 54–62.

Turning to FIG. 5, the base communications unit formed by IR assembly 30 and IR second interface 32 within drive 16 includes a starting step 80. A time delay step 82 is reached which imposes e.g. a one second program flow delay. The delay step 82 is followed by a logical step 84 which checks for a predetermined synchronization pattern from the field unit 50. If a sync pattern from the field unit 50 is not detected, a return is made to step 82 and the scanning process repeats until a sync pattern is detected by drive microprocessor 28. Once a valid sync pattern is detected, the drive 16 sends a predetermined response pattern (e.g. a unique password pattern) back to the field unit 50 via the second interface 32 and IR front end 30. The response pattern is repeated a predetermined number of times as tested by a logical step 88. A field unit password may be checked at this step 88 to determine that the particular field unit 50 has a requisite security level for access to the drive 16 via the secondary IR port.

Once the return pattern has been echoed the requisite number of times, a step 90 is reached which awaits, detects and responds to one of the plurality of available commands:

e.g. test 70, diagnostics 72, firmware code update 74, and end 76. Once the end command 76 has been received and decoded by the drive microcontroller 28 at the step 90, a step 92 causes the drive microcontroller 28 to reset and thereby return to normal drive operations. If a firmware code update 74 has occurred, the microprocessor 28 resets so that it may execute the updated control code.

The code update routine 74 requires a highest level of security. Therefore, preferably at least two unique passwords are required from the drive 16 before any updated code is downloaded to the drive. Password sequences received from the drive by the field unit 50 may be checked in real time by the remote host computer 60 against a product database before being sent by the mobile unit PDA 50 to the drive 16, thereby to inhibit unauthorized access to the update code.

The data diagnosis/analysis routine 72 is a low security function and only requires a single password to the drive 16. This function is used to collect into field unit 50 all logged failures as well as other pertinent information, such as version of current firmware resident within the drive 16. This mode is particularly useful for a field service engineer, as well as for collecting life testing/failure mode data within the design/manufacturing process. It enables diagnostic data to be collected without interrupting or disturbing normal or test data flows over the primary drive bus 44, which may be important in certain factory testing operations.

The test function 70 is a medium security function and preferably two passwords would be required before the field unit 50 will be permitted to perform tests upon the drive 16. Tests may include a quick test, a field base test, a comprehensive manufacturing/quality assurance test carried out e.g. within the factory, or burn-in testing with the unit 50A operative within a burn-in chamber, etc.

Other miscellaneous commands may be sent and received, such as reading predictive failure counters, reading RAM memory 34, seek and head position commands, etc. These commands may be invoked by a field service engineer to ascertain that the drive 16 is functional without having to hook into the primary bus structure or load a tape into the drive. For example, a field service engineer equipped with the field unit 50 and a test tape, could load the test tape into the drive 16 and then command the drive 16 to read and write portions of the test tape, and analyze results via the secondary port path without involving the computer 10. This capability enables a field service engineer rapidly to pinpoint problems at the computer level, or interface bus level, rather than at the drive level. Also, the field unit 50 enables a download of recorded user information to remote host computer 60 from e.g. a hard disk drive 16 in the event of a failure of computer system 10 at a level other than the hard drive level. This functionality provides a heretofore unavailable backup capability via the front panel.

When the present invention is used in manufacturing as shown in FIG. 3, the task consists of starting tests within each drive 16 and collecting test results. Preferably, the results of the testing are returned to the host computer 60 via a wire or radio frequency cellular link, and collected into a central data base used to track the particular drive 16 during its useful product life time.

To those skilled in the art, many changes and modifications will be readily apparent from consideration of the foregoing description of a preferred embodiment without departure from the spirit of the present invention, the scope thereof being more particularly pointed out by the following claims. The descriptions herein and the disclosures hereof are by way of illustration only and should not be construed as limiting the scope of the present invention which is more particularly pointed out by the following claims.

What is claimed is:

1. A computer peripheral mass storage device for providing mass storage of user digital data to a computer and including an embedded device microcontroller, and a primary user data interface structure for passing digital user data recorded on storage media to a digital computer electrically connected to the computer mass storage device via a primary electrical bus structure, the computer peripheral mass storage device being included in a device housing and further comprising:

a front panel of the device housing accessible to the user, a bidirectional optical path extending through the front panel and viewable by the user, the bidirectional optical Path including a separating device for separating light energy into two components, a first visible light emission device operated by the embedded device microcontroller and coupled to the optical path for providing visual indication of device activity or status to the user, a second bi-directional optical light emission/detection means coupled to the optical path and providing a wireless secondary interface of the peripheral mass storage device for receiving and sending device-specific information from and to an external device-specific data source, optical path emission/detection support circuitry connected to the emission/detection means, a secondary bidirectional interface digital port interconnecting the device microcontroller and the optical path emission/detection support circuitry, for enabling the embedded device microcontroller to receive and send device-specific information from and to the external device-specific data source.

2. The computer peripheral mass storage device set forth in claim 2 wherein the device comprises a digital streaming tape drive.

3. The computer peripheral mass storage device set forth in claim 2 wherein the device comprises an optical disk drive.

4. The computer peripheral mass storage device set forth in claim 1 wherein the device comprises a hard disk drive.

5. The computer peripheral mass storage device set forth in claim 1 wherein the separating device comprises a prism located interiorly adjacent of the front panel for directing light energy between the path and the optical path emission/detection means in a first direction, and for directing visible light energy from the first visible light emission device to the optical path in a second direction.

6. The computer peripheral mass storage device set forth in claim 1 wherein the optical path emission/detection means comprises an infra-red light energy emitter and an infra-red light energy receiver.

7. The computer peripheral mass storage device set forth in claim 1 wherein the external device-specific data source comprises a portable peripheral storage device service computer in effective optical proximity to the computer peripheral mass storage device and including an optical path detection/emission means for passing light energy carrying the device-specific information between the service computer and the optical path of the computer peripheral mass storage device.

8. The computer peripheral mass storage device set forth in claim 7 wherein the portable peripheral storage device service computer comprises a personal digital assistant device having a bidirectional optical port directed at the optical path of the computer peripheral mass storage device.

9. The computer peripheral mass storage device set forth in claim 7 wherein the portable peripheral storage device service computer comprises a factory robot having a bidirectional optical port directed at the optical path of the computer peripheral mass storage device.

10. The computer peripheral mass storage device set forth in claim 1 wherein the device microcontroller collects device status information and sends the device status information to the external device-specific data source via the wireless secondary interface.

11. The computer peripheral mass storage device set forth in claim 1 wherein the external device-specific data source sends firmware updates to the device microcontroller via the wireless secondary interface.

* * * * *